United States Patent [19]
Van Dyck

[11] 3,956,682
[45] May 11, 1976

[54] TWO-WIRE POSITION-TO-D.C. CURRENT TRANSDUCER

[75] Inventor: Donald Edwin Van Dyck, Chatham, N.J.

[73] Assignee: Pennwalt Corporation, Philadelphia, Pa.

[22] Filed: Mar. 28, 1974

[21] Appl. No.: 455,685

[52] U.S. Cl. ............................. 318/640; 318/676
[51] Int. Cl.² ........................................... G05B 1/06
[58] Field of Search ........................... 318/676, 640

[56] References Cited
UNITED STATES PATENTS

| | | | |
|---|---|---|---|
| 2,721,277 | 10/1955 | Boundy et al. | 318/640 X |
| 2,728,041 | 12/1955 | Boundy et al. | 318/676 X |
| 3,128,429 | 4/1964 | Pattee | 318/676 X |
| 3,211,003 | 10/1965 | Worden | 318/676 X |
| 3,213,694 | 10/1965 | Clark et al. | 318/676 X |
| 3,277,367 | 10/1966 | Petersen | 318/640 X |
| 3,450,969 | 6/1969 | Sato et al. | 318/640 |
| 3,465,221 | 9/1969 | Arce et al. | 318/640 |
| 3,581,181 | 5/1971 | Wallace | 318/640 |
| 3,767,992 | 10/1973 | Edwards et al. | 318/640 |
| 3,770,890 | 11/1973 | Winkler | 318/640 X |
| 3,868,556 | 2/1975 | Lesure | 318/640 |

Primary Examiner—B. Dobeck
Attorney, Agent, or Firm—Charles N. Quinn

[57] ABSTRACT

A two-wire transmitter for converting a motion input into a D.C. milliampere output signal that varies linearly with the angular rotation of a mechanical arm. The transmitter employs a position balance principle accomplished by reflecting a light beam from a light emitting diode against a mirror of a D'Arsonval movement upon a dual element photocell. Movement of the input arm displaces the light beam to unbalance a bridge circuit, the increase voltage thereof increasing the current in an output loop which is fed back through the D'Arsonval motor coil. Rotation of the coil rotates the mirror to swing the light beam toward the center of the photocell and rebalance the system to meet new input conditions.

11 Claims, 8 Drawing Figures

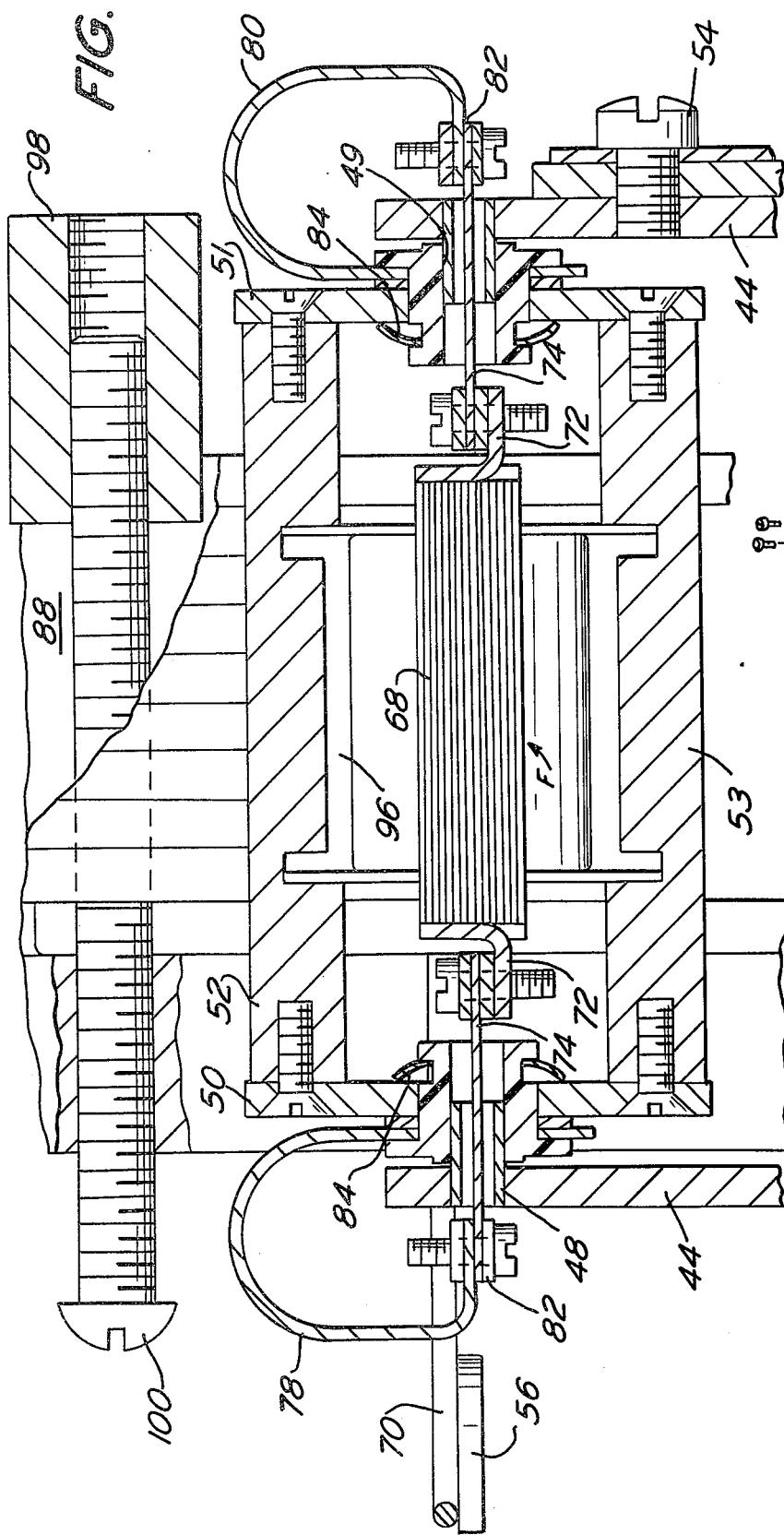

TWO-WIRE POSITION-TO-D.C. CURRENT TRANSDUCER

This invention relates to an instrument for converting a motion input in the form of a displacement into a proportional electrical current output. More particularly, this invention relates to transducers which produce a D.C. milliampere output signal directly proportional to mechanical movement or displacement sensed by a detecting device, such as an indicator or recorder, in response to a variable condition, for example, rate of flow, liquid level, or other process parameters. The transducer of the present invention embodies an electronic amplifier and servo system in which the same two-wire power lines for supplying voltage for the electrical circuitry are used to transmit the electrical current output signal.

It is an object of this invention to provide a transducer for converting a motion input into a proportional electrical current output.

Another object of this invention is to provide a position versus force balance system in which no reactive forces, such as electrostatic or magnetic, other than minimal frictional effects, operate upon the motion input.

Still another object of this invention is to provide a position to current transducer in which reactive loads upon the input are minimized.

A further object of this invention is to provide a position to milliampere two-wire transmitter in which the output signal is transmitted across the same two wires powering the electronic circuitry.

Yet still a further object of this invention is to provide a two-wire transmitter which will permit a lower voltage power supply and a greater load resistance together with a compact constructional design.

Yet another object of this invention is to provide a position-to-current transducer which is stable without the use of mechanical damping.

An additional object of this invention is to provide a position-to-current transducer which employs a position balance principle relying on a light beam directed upon a photocell.

Further objects of this invention are to provide a photoelectric position-to-current transducer in which complete compensation is secured for variations in power supply voltages, light intensity conditions, and temperature effects.

The transducer of the present invention is a two-wire transmitter which is designed to produce a D.C. milliampere signal output that varies linearly with the rotation of a motion input arm which is responsive to a sensor, such as an indicating instrument, for detecting an external variable condition, for example flow rate, by way of a magnetic coupling to a rotary flowmeter float or to a float in a weir or flume. The motion input arm is rotatably positioned through a very small angle via a cam that rotates with the indicator pointer of the sensor. A minute force, just enough to overcome an infinitesimally small degree of friction positions the arm which follows the cam, whereby no reactive forces, such as electrostatic or magnetic, produce or induce deviational loading.

The position versus force balance principle is accomplished by bracketing a light emitting diode on the input arm and directing the focused light beam therefrom against a mirror for reflection upon a predetermined portion of a fixed dual element photocell. The mirror is physically mounted on the armature coil of a D'Arsonval galvanometer motor so that the mirror can be rotated by changing the current through the motor coil.

The transmitter is preadjusted so that in response to a predetermined first condition, for example zero pointer reading the light beam is reflected from the mirror to the center of the dual-element photocell. The electronic circuitry is also preadjusted so that a predetermined output loop signal is produced across a load. When the sensor is displaced in position corresponding to a second condition whereby the indicator reading is increased, the cam follower arm and hence the light emitting diode is rotated so that the light beam is displaced toward one, the positive, element of the photocell. The increased light intensity lowers the resistance of the positive element and unbalances a bridge circuit to increase the voltage output thereof. The increased voltage is applied to an operational amplifier which produces an increased current output into a Darlington pair of transistors whose conductivity increases to produce an increased current through the D'Arsonval motor coil and the entire two-wire loop. This increase in current rotates the motor coil against the spring rate of its suspension bands, thus rotating the mirror mounted on the coil in a direction which swings the light beam back toward the center of the photocell to reduce the bridge output and rebalance the system to meet the new sensed indicator reading in response to the variable condition being detected.

Other objects of this invention are to provide an improved device of the character described which is easily and economically produced, sturdy in construction, and highly efficient in operation.

With the above and related objects in view, this invention consists of the details of construction and combination of parts as will be more fully understood from the following detailed description when read in conjunction with the accompanying drawing in which:

FIG. 7 is an enlarged partial cross-sectional view taken along lines 7—7 of FIG. 5.

FIG. 8 is a fragmentary perspective view of the D'Arsonval movement embodied in this invention.

Figure 1:
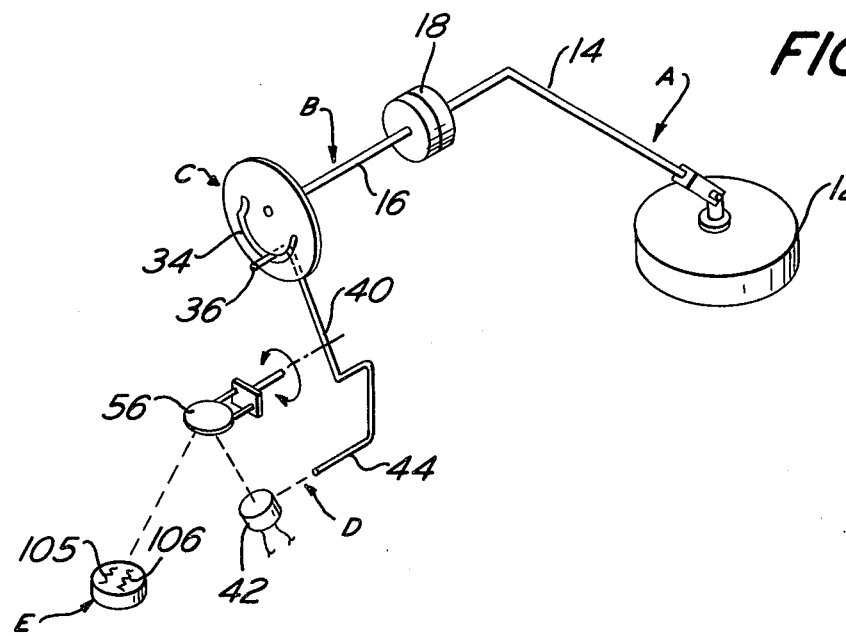
FIG. 1 is a diagramatic perspective view of the basic elements of the transducer system for converting a rotary displacement into an electrical signal, according to this invention.

Referring now in greater detail to the drawings in which similar reference characters refer to similar parts, there is shown an instrument for measuring a variable condition and as a percent of the condition measured transmits a proportioned electronic milliampere signal which may be used for the operation of a process or act as a remote indicator or recorder. As shown in the drawings, the embodiment herein relates to a flow meter-transmitter for measuring the flow rate in a Parshall flume, or rectangular, trapezoidal or triangular weir, and includes a flow measuring device, generally designated as A which is responsive to the variable condition of flow. The measuring device A illustrated in FIG. 1 comprises a float 12 which rises and falls with liquid level and by way of a schematically represented moment arm 14 pivotally coupled to the float 12 converts a linear displacement into a rotary motion to a shaft 16 of a sensor B through a magnetic coupling 18, also schematically designated. The measuring device A might similarly be any other flow meter system, such as is shown and described in U.S. Pat. No. 3,315,523 wherein the longitudinal displacement of a rotary-type float contained in a tapered guide tube remotely actuates a rotary indicator shaft through a magnetic rod and pivotally disposed bar magnets.

Figure 5:
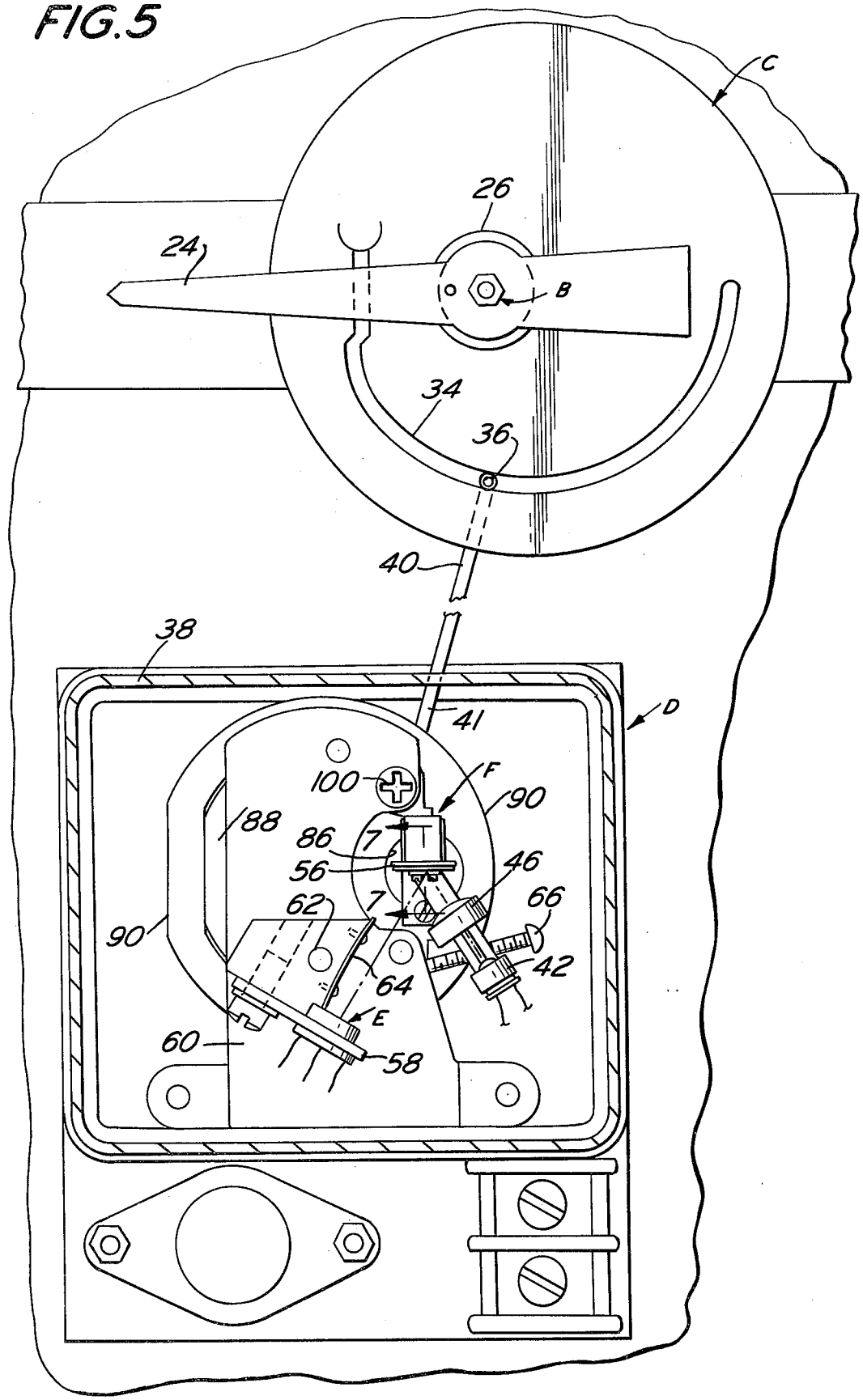
FIG. 5 is a front elevational view and partly broken away of the transducer for converting a rotary input motion into a proportional electrical current output.
Figure 6:
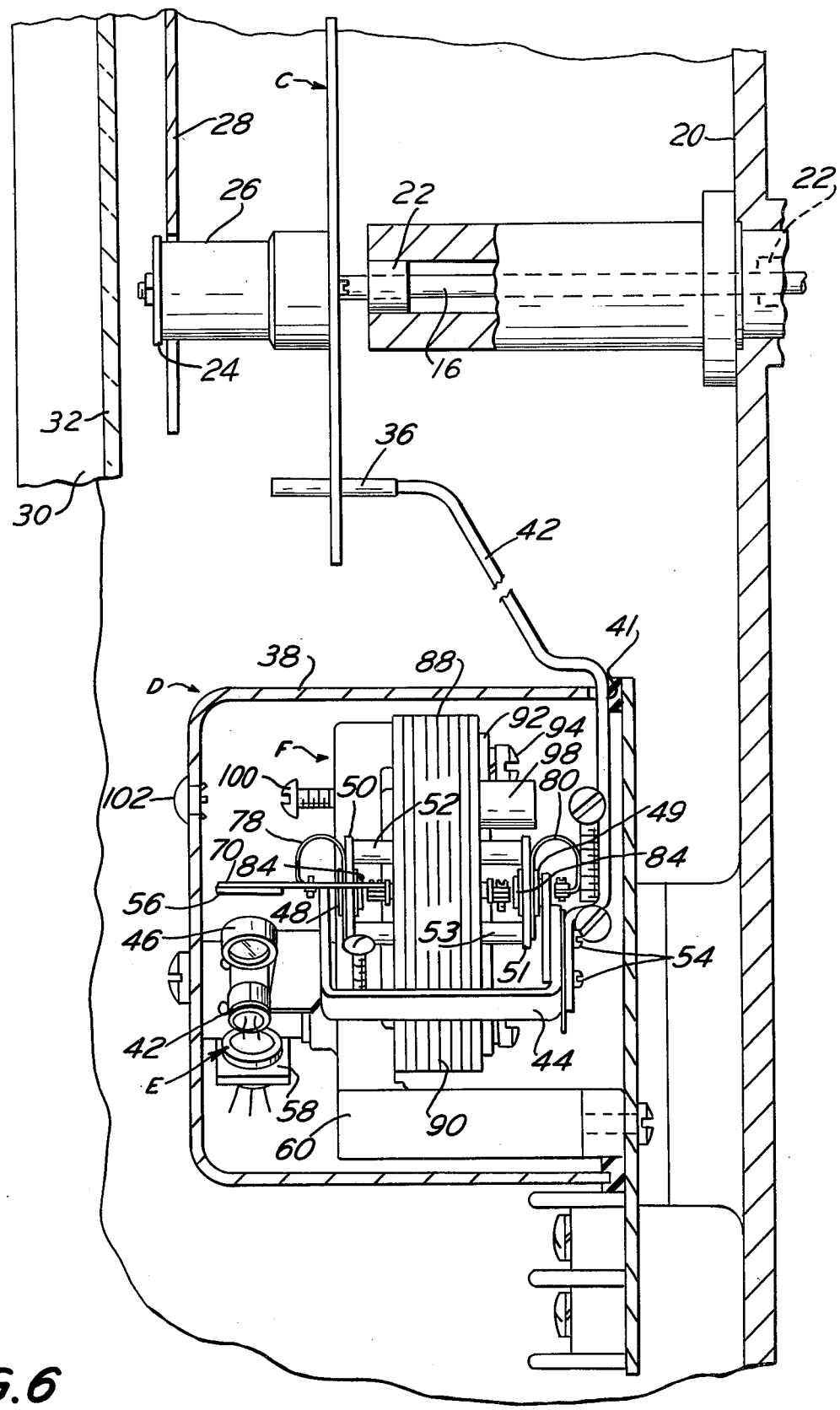
FIG. 6 is a side elevational view thereof and partly broken away.

The sensor B, as best illustrated in FIGS. 1, 5 and 6, is basically an indicator and includes a casing 20 which rotatably supports the shaft 16 in bearings 22. A pointer 24 is affixed to the shaft 16 by way of hub 26 and registers the rotary displacement of the measured condition on a dial 28. A cover 30 and window 32 enclose the front portion of the casing 20 and seal the internal parts of the sensor B, all of which is conventional and assembled in a manner well known in the instrumentation field.

Affixed to the medial portion of the shaft 16 is a cam C having an internal eccentrically disposed slot 34 which defines a "rise" as the indicator pointer 24 rotates clockwise as shown in FIGS. 1 and 5. A cam follower arm 36 rides in the track 34 and is itself pivotally supported with respect to a transducer D mounted in a housing 38 disposed on the front of the back wall of the casing 20. The cam follower 36 is thereby caused to rotate counterclockwise with clockwise rotation of the cam C and operates as a motion input arm to the transducer D through extension portion 40 passing within an opening 41 in the housing 38.

The transducer D includes a light source 42 in the form of a light emitting diode lamp which is affixed to one leg of pivot bracket 44, the rays of light emitted by the diode 42 being focused by lens 46 also supported on same leg of the bracket mount 44. The bracket mount 44 is of generally U-shaped configuration and is rotatably supported by the spaced legs thereof on bearings 48 and 49. The bearings 48 and 49 are contained within end frames 50 and 51 which are spaced from each other and screwed together on upper and lower side frames 52 and 53. The input extension arm 40 of cam follower 36 is attached by screws 54.

The lens 46 directs the rays of light from the light emitting diode 42 against mirror 56 from which the beam of light is focussed upon a dual-element photocell E mounted within a retainer 58. The retainer 58 and the photocell E are located in fixed position on bracket block 60 by machine screw 62 threaded therethrough. A "finder" reflector 64 is pinned to the front surface of the block 60 substantial normal to the surface of the photocell E in order to redirect the beam of light from the diode 42 back on the photocell E in the event that the beam is too far askew. A stop screw 66 threaded into the bracket block 60 acts to limit the maximum pivotal movement of the input arm 40 by the screw head 66 engaging the adjacent leg of bracket mount 44.

The mirror 56 is part of a D'Arsonval movement, generally designated as F, and is physically mounted upon the armature coil 68 thereof by hairpin 70. The coil 68 contains a plurality of fine wire elements wound in the form of a generally flat rectangular ring and operates as a feed back unit. L-shaped posts 72 are cemented to the ends of the coil 68 and to the opposing lead-in wire ends. Slender flat suspension bands 74 are clamped to each of the post 72 by screws 76, and project outwardly from the coil 68 to define a resilient rotary support therefor. The outboard ends of the bands 74 pass freely through internal tubes in the bearings 48 and 49 and are secured to the free ends of taut band springs 78 and 80 by means of screw clamp retainers 82. The inboard ends of the taut band springs 78 and 80 are locked within the outer periphery of bearings 48 and 49 by retainer rings 84.

The band springs 78-80 and the strip bands 74 suspend the coil 68 within an arcuate recess 86 at the end of a generally trapezoidal-shaped magnet 88, the recess 86 defining one pole of the magnet, as shown in FIGS. 6, 7 and 8. A soft iron ring 90 peripherally interfits about the exterior of the magnet 88 except for the area about the recess 86. The ring 90 and the magnet 88 are secured by clamping plates 92 and screws 94 to the bracket block 60. Magnetic flux is directed from the recessed pole 86 across the air gap within which the coil 68 is suspended and returns to the opposite pole by way of the ring 90. A cylindrical core 96 held in fixed disposition inside the coil 68 acts to concentrate the magnetic flux field through the coil windings. A soft iron slug 98 is fixed to the end of a span adjusting screw 100 which is threaded within bracket block 60 whereby the slug 98 is adapted to be drawn into an open zone between the magnet 88 and the ring 90. The slug 98 when drawn into the open zone acts as a shunt for the magnetic flux away from the recess 86 in which the coil 68 is suspended thereby decreasing torque on the coil with consequent diminished feed back so as to provide greater span of output signal. Access to the span adjusting screw 100 is obtained by removing button plug 102 from aperture in the housing 38.

Figure 2:
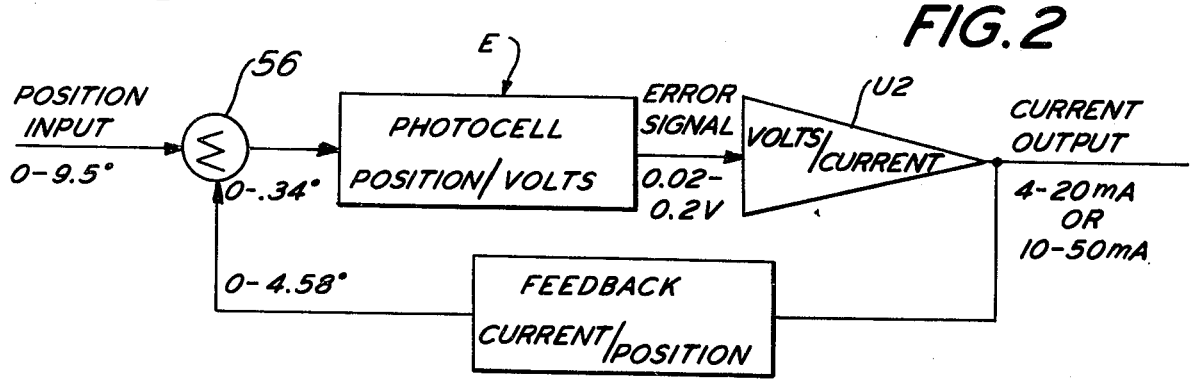
FIG. 2 is a block diagram of the servo-feedback-transmitter system in accordance with the present invention.
Figure 3:
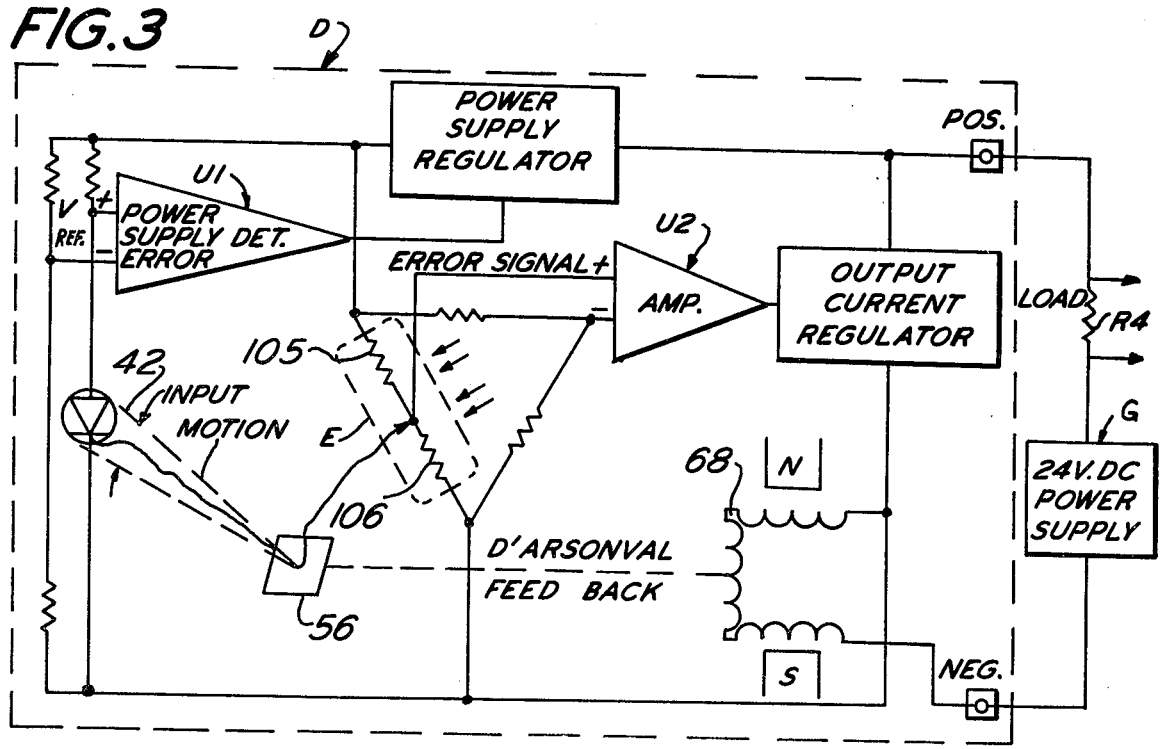
FIG. 3 is a simplified block-schematic diagram of the transmitter of the electrical control circuit embodied in the present invention.
Figure 4:
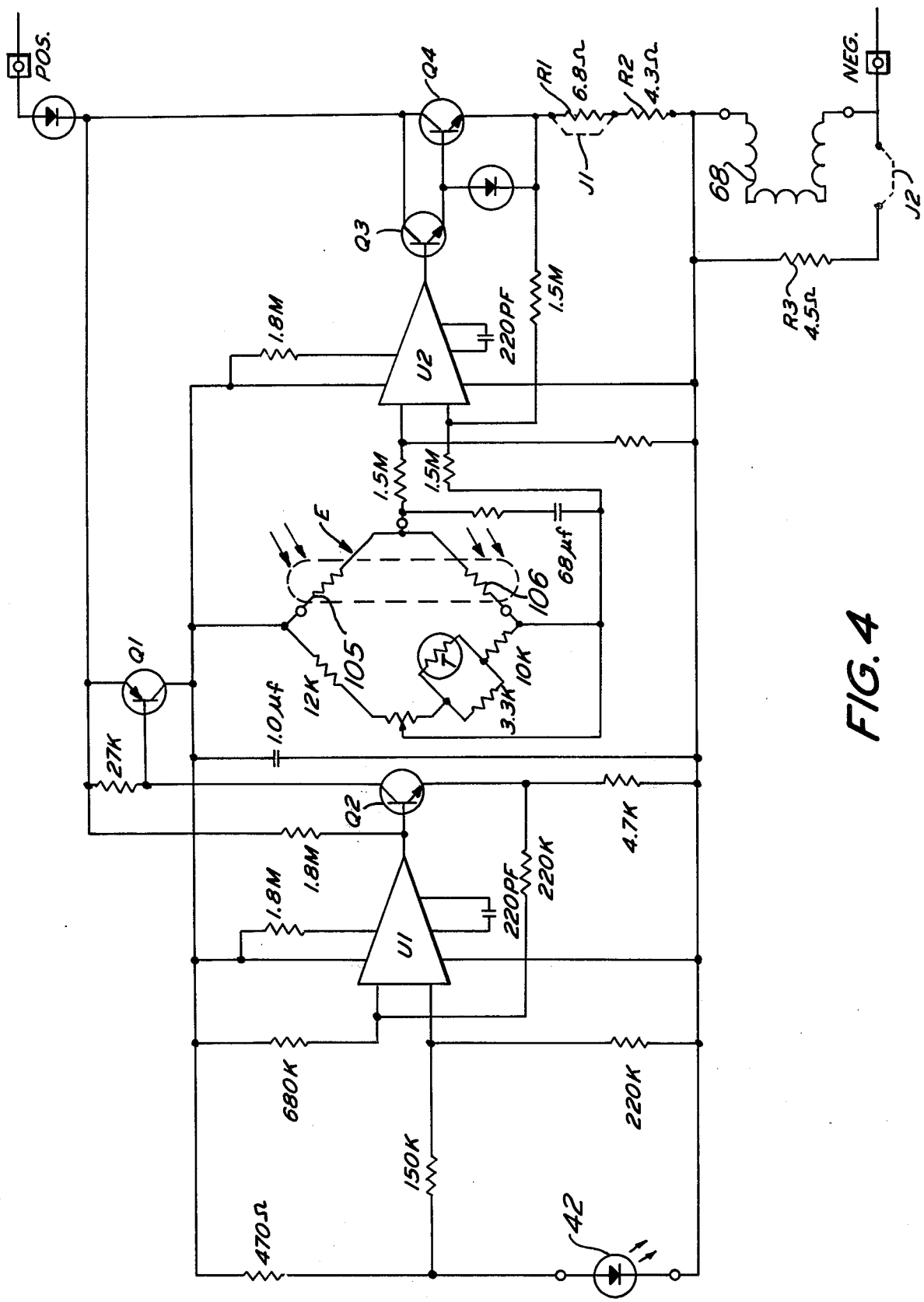
FIG. 4 is a wiring diagram of the two-wire electronic transmitter of this invention.

Referring now to FIGS. 2, 3 and 4, the transducer D is adjusted with the indicator pointer 24 at zero so that the light beam is reflected to the center zone between the elements 104 and 105 of photocell E. The electronic circuitry is adjusted by way of bridge potentiometer so that the output loop signal is 4 milliamperes (in the lower 4–20 mA range) or 10 milliampers (on the 10–50 mA range). Use of the dual-element photocell E permits the bridge to be temperature compensated and balanced regardless of the light intensity. Use of the light emitting diode lamp 42 minimizes power drain on the power supply far below that required by a filament lamp. If the indicator 24 reading increases, the cam C rotates clockwise (as shown in FIG. 5) so that the follower 36 rises in the cam track 34 and effects counter clockwise rotation of input arm 40. The bracket mount 44 is similarly rotated whereupon the light beam from the diode lamp 42 is displaced after reflection from mirror 56 toward the positive element 105 of the photocell E. The increased light intensity lowers the resistance of element 105, unbalancing bridge circuit D1 and increasing the voltage output of said bridge D1 to product an error signal. This voltage is applied to an operational amplifier U2 which responds by increasing the current output therefrom into a pair of transistors Q3 and Q4 (Darlington pair) whose conductivity also increases to produce an increased regulated output current through the D'Arsonval motor coil 68 and the feedback loop via load resistors R1 and R2, if the former is not shunted by jumper J1, for the 4 to 20 mA scale reading. Jumper J2 is also added to parallel the resistor R3 with the coil 68 when the higher scale is desired. Thus, for the higher scale reading, shunting resistor R1 decreases the resistance in the feedback loop thereby increasing gain while incorporating resistor R3 across the coil 68 by way of jumper J2 similarly increases the current flow for increased gain.

Power supply G is coupled across the output loop, the latter including load resistor R4, by way of which the output current signal is drawn from the very same two wires. Operational amplifier U1 constitutes a 3 volt power supply for the electronics in the system, transistors Q1 and Q2 acting as regulators for the latter power supply.

As may be seen from FIGS. 3 and 4, the increased current through the feedback and output loops resulting from the error signal from the bridge D1 rotates the D'Arsonval motor coil 68 against the spring rate of the suspension bands 74, 78 and 80. Accordingly, the mirror 56 which is mounted on the coil is rotated in a direction that swings the light beam back towards the center of the photocell E to reduce the bridge D1 output. Hence, the system becomes rebalanced to meet the new input conditions.

It is to be noted that the complete range of output current (4–20 mA or 10–50 mA) requires only about 4.6 degress of angular movement of the mirror which corresponds to about 0.008 inch movement of the light beam on the photocell E.

Since the light beam from the diode 42 creates no mechanical force in itself, as a consequence, there is no loading of the input, thus assuring minimal reactive forces with the result that movement of the input arm is directly proportional to indicator reading. Therefore, the milliampere signal output across the two wire load resistor R4 varies directly with indicator disposition.

Although this invention has been described in considerable detail, such description is intended as being illustrative rather than limiting, since the invention may be variously embodied without departing from the spirit thereof, and the scope of the invention is to be determined as claimed.

What is claimed is:

1. A transducer for converting a motion input into a D.C. milliampere electrical signal which varies linearly with angular rotation of a mechanical input arm comprising:
   a. a mirror hingedly supported about a predetermined axis including motor means for rotating said mirror in response to an error signal;
   b. a light source on said input arm and directing a beam of light against said mirror for reflection upon a photocell;
   c. a photocell comprising a dual element photosensitive system, said elements being disposed in opposing arms of a bridge circuit in order to compensate for variations in intensity of the light beam, said first zone being centrally disposed between said dual elements;
   said light source being directed upon a predetermined zone of said photocell in response to a first position of said input arm and displaced toward a second zone of said photocell in response to a second position of said input arm; said photocell delivering an error signal when the light beam is displaced from said first to said second zone thereof;
   d. servo means responsive to the error signal and actuating said motor means until the mirror is rotated in a direction that swings the light beam toward the first zone of said photocell to cancel said error signal; and
   e. electronic means delivering an output current signal, proportional to the error signal from said photocell.

2. The transducer of claim 1 wherein the error signal constitutes a voltage output from said bridge circuit.

3. The transducer of claim 2 wherein an operational amplifier is coupled to the voltage output of said bridge circuit, and a pair of transistors coupled in Darlington configuration to the output of said operational amplifier to deliver a regulated current output to said feedback and output lines.

4. The transducer of claim 1 wherein said light source comprises a light emitting diode lamp.

5. A transducer for converting a motion input into a D.C. milliampere electrical signal which varies linearly with angular rotation of a mechanical input arm, comprising:
   a. a mirror mounted on an input arm hingedly supported about a predetermined axis including means for rotating said mirror in response to an error signal;
   b. a photocell;
   c. a light source on said input arm and directing a beam of light against said mirror for reflection upon said photocell, said beam of light being directed upon a predetermined zone of said photocell in response to a first position of said input arm and displaced toward a second zone of said photocell in response to a second position of said input arm, said photocell delivering an error signal when the light beam is displaced from said first to said second zone thereof;
   d. servo means responsive to the error signal and actuating said means for rotating said mirror until the mirror is rotated in a direction that swings the light beam toward the first zone of said photocell thereby tending to cancel said error signal;
   e. electronic means delivering an output current signal, proportional to the error signal from said photocell;
   f. a sensor responsive to a variable condition and developing a displacement with respect thereto, said sensor comprising rotationally positioned indicator means;
   g. linkage means coupling said sensor to said input arm, said linkage means comprising a cam rotatable with said indicator means, including a follower in engagement with said cam and connected to said input arm.

6. The transducer of claim 5 wherein said cam is rotatable on a shaft of said indicator means and includes an internal cam track having a rise in which the follower rides.

7. Apparatus for determining changes in the position of a float means in a fluid and for producing a direct current output signal which varies linearly with changes in the position of the float, comprising:
   a. a float means suitably disposed to rise and fall upon changes in a fluid level;

b. a moment arm pivotably coupled to said float means for converting linear displacement of said float means into a rotational displacement;
c. magnetic coupling means to connect said moment arm to a shaft means;
d. shaft means for transmitting rotary motion to a sensor means;
e. sensor means, said sensor means further comprising:
   i. a pointer means fixed to said shaft by a hub means;
   ii. casing means rotatably supporting the shaft means in a bearing means;
   iii. bearing means;
   iv. hub means; and
   v. dial means for allowing the visual determination of relative movement of said pointer means;
f. cam means affixed to said shaft means and having an internal eccentrically disposed slot therein;
g. cam follower means disposed within said internal eccentrically disposed slot in said cam means and being pivotably mounted with respect to a transducer mounted within a housing;
h. a transducer means for producing a direct current output signal which varies directly proportionally to the rise and fall of said float means;
i. a housing surrounding said transducer, said housing having a slot therethrough;
j. an extension portion of said cam follower means, extending through said slot in said housing to said transducer, said extension portion acting as a motion arm input to said transducer.

8. The apparatus of claim 7 wherein said transducer means further comprises:
   a. a light source;
   b. a pivot bracket having said light source mounted on one leg thereof;
   c. a lens for focusing light emitted by said light source, said lens also being mounted on said one leg of said pivot bracket;
   d. a mount for said pivot bracket;
   e. bearings for supporting said pivot bracket on said mount;
   f. screw means for securing said extension portion of said cam follower means to said pivot bracket;
   g. a photocell fixedly mounted within said housing in position for reflection thereon, by a mirror, of light emitted by said light source;
   h. a mirror, fixedly secured to an armature coil of a D'Arsonval movement, for reflecting light leaving said lens onto said photocell;
   i. reflector means, adjacent to said photocell, for reflecting light emitted by said light source onto said photocell in the event said light is too far askew from said photocell to shine thereon, either due to movement of said light source or due to movement of said mirror;
   j. a D'Arsonval movement having a coil consisting of at least one fine wire element would in the form of a flat rectangular ring;
   k. resilient rotary support means, having said D'Arsonval movement pivotably mounted thereon, for supporting said D'Arsonval movement, said resilient rotary support means being disposed to exert a force on said coil which tends to return said coil to an initial position once said coil has been displaced from said initial position;
   l. magnet means having a recess therein at one magnetic pole thereof and having said coil of said D'Arsonval movement disposed within said recess such that upon movement of said coil, magnetic lines of force are cut by said coil; and
   m. magnetic shunt means, being optionally disposed for insertion into said recess in said magnet, for shunting magnetic flux away from said recess so that a lower number of magnetic lines of force are cut by said coil upon movement thereof.

9. The apparatus of claim 8 wherein said transducer means for producing a direct current output signal, which varies directly proportionally to the rise and fall of said float means, further comprises:
   a. an electrical resistance bridge having said photocell as the resistive element in one leg of said bridge;
   b. a variable resistor disposed in series in one of the other legs of said bridge;
   c. a power supply comprising at least one operational amplifier and at least two transistors suitably disposed for regulation of the output of said operational amplifier, said power supply supplying a direct current voltage to the electrical resistance bridge;
   d. an operational amplifier having as an input thereto an error signal from said electrical resistance bridge;
   e. at least two transistors, having as at least a portion of the input thereto the output of said operational amplifier which has as an input thereto the error signal from the electrical resistance bridge, said two transistors having at least a portion of the output thereof fed through said D'Arsonval coil.

10. The apparatus of claim 9 wherein said photocell is a dual element photocell, each element of the photocell having an electrical resistance property which changes with a change in the amount of light incident thereon; wherein said electrical resistance bridge is a four leg electrical resistance bridge; wherein said two elements of said photocell comprise two of the four legs of said bridge; wherein said variable resistor is disposed in series in a third of the four legs of said bridge; wherein a displacement of said float means results in a rotation of said cam means, thereby resulting in a displacement of the cam follower means and consequent rotation of said extension portion of said cam follower means, thereby further resulting in a rotation of said pivot bracket, consequently moving said light source, thereby causing light emitted by said light source, passing through said lens and being reflected by said mirror, to be displaced from the position where it had previously impinged upon said photocell, said photocell electrical resistance changing in response thereto, thereby changing the electrical resistance in at least one leg of said electrical resistance bridge and thereby changing an output voltage of said bridge, said changed output voltage being denominated as an error signal, said error signal resulting in a change in the output of said electrical amplifier which operates on the error signal from the electrical resistance bridge, said change in the output of said electrical amplifier producing, via a change in the conductivity of said transistors, a change in a current passing through said coil; said change in current passing through said coil causing a rotation of said coil against the force exerted on said coil by said resilient rotary support means due to interaction of an electromotive force produced by said current change through said coil with the lines of magnetic flux passing through said coil due to said coil being in a recess at the pole of said rotation of said coil causing a change in position of said mirror secured thereto thereby changing the position of said light on said photocell, said change being towards the center of said photocell such that the apparatus tends to become rebalanced to meet a new change in position of said float means.

11. The apparatus of claim 10 wherein all electrical currents through all electrical elements are direct electrical currents and wherein at least a portion of an output signal of said apparatus must always pass through said coil.

* * * * *